US010445263B2

United States Patent
Pronozuk et al.

(10) Patent No.: US 10,445,263 B2
(45) Date of Patent: Oct. 15, 2019

(54) CARRIER BOARD WITH REMOVABLE MEMORY MODULE POWER FAIL PROTECTION

(71) Applicant: Seagate Technology LLC, Cupertino, CA (US)

(72) Inventors: Anthony John Pronozuk, Loveland, CO (US); Nikhil Seshasayee, Karnataka (IN); Ashley Caciano Fernandes, Goa (IN)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 142 days.

(21) Appl. No.: 15/335,219

(22) Filed: Oct. 26, 2016

(65) Prior Publication Data

US 2018/0113822 A1    Apr. 26, 2018

(51) Int. Cl.
| | |
|---|---|
| G06F 13/16 | (2006.01) |
| G06F 13/40 | (2006.01) |
| G06F 13/42 | (2006.01) |
| G06F 1/28 | (2006.01) |
| G06F 1/30 | (2006.01) |
| G11C 5/14 | (2006.01) |
| G11C 5/04 | (2006.01) |

(52) U.S. Cl.
CPC ............ *G06F 13/1694* (2013.01); *G06F 1/28* (2013.01); *G06F 1/30* (2013.01); *G06F 13/4068* (2013.01); *G06F 13/4282* (2013.01); *G11C 5/04* (2013.01); *G11C 5/14* (2013.01)

(58) Field of Classification Search
None
See application file for complete search history.

(56) References Cited

U.S. PATENT DOCUMENTS

| | | | |
|---|---|---|---|
| 8,289,801 B2 | 10/2012 | Smith et al. | |
| 8,527,693 B2 | 9/2013 | Flynn et al. | |
| 8,850,091 B1* | 9/2014 | Karamcheti | ........ G06F 12/0246 710/62 |
| 8,880,765 B2* | 11/2014 | Melvin, Jr. | ......... H02J 13/0075 340/870.03 |
| 9,619,848 B2* | 4/2017 | de Castro | .............. G06Q 50/06 |
| 2004/0156151 A1* | 8/2004 | Morrow | .................. G06F 1/266 361/18 |
| 2010/0153621 A1* | 6/2010 | Kreiner | ................. G06F 3/0607 711/103 |
| 2017/0315873 A1* | 11/2017 | Alcorn | ................... G11C 5/141 |

* cited by examiner

*Primary Examiner* — Henry Tsai
*Assistant Examiner* — Christopher A Bartels
(74) *Attorney, Agent, or Firm* — Holzer Patel Drennan

(57) ABSTRACT

A carrier board for use with a host computing system includes bus connectors for one or more removable memory modules. The carrier board includes energy storage components and control circuitry to charge the energy storage components using a voltage source provided by the host computing system. If the host computing system experiences a power failure, the control circuitry initiates discharge the energy storage components to power the carrier board. As such, the memory controller on the carrier board may initiate steps to secure any data that would have been lost due to the power failure, such as data that is part of write operations in progress at the time of the power failure or data to be migrated as part of garbage collection operations.

20 Claims, 4 Drawing Sheets

CARRIER BOARD WITH REMOVABLE MEMORY MODULE POWER FAIL PROTECTION

BACKGROUND

Carrier boards may be incorporated into a computing system environment, such as carrier "add-on" boards designed to add features to, or expand features present in, the computing system. If a computing system loses power, the incorporated carrier boards likely will lose power too, unless there is a back-up power solution. Power loss to carrier boards may cause unintended or detrimental effects to the computing system due to interruption of the tasks performed by the carrier board, including negatively affecting a host computing system.

SUMMARY

A carrier board configured, such as a carrier board configured for use with an expansion bus on a host computing system, has computer bus interfaces and expansion card specification, such as M.2 computer bus interfaces and expansion cards, to support removable modular data storage devices, such as SSD storage devices with volatile and/or non-volatile storage media. The carrier board includes power protection circuitry with energy storage components, such as capacitors, rechargeable batteries, etc., on the carrier board to store power for use in case of an unexpected power failure. The power protection circuitry includes a power fail (power fail) controller and an electronic fuse (E-Fuse) to control and monitor the power supply to the carrier board, and to initiate discharge of the energy storage components in the event of power loss, e.g., when the voltage source from the host computing system satisfies a power failure condition. The power protection circuitry may protect against data loss in the event of an unexpected power loss by notifying and providing power to a memory controller and removable data storage devices with energy stored in the energy storage components via one or more voltage regulators. The memory controller may complete data write operations that are in-progress or write data cached in volatile memory at the time that the voltage source from the host computing system satisfies a power failure condition.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

Figure 1:
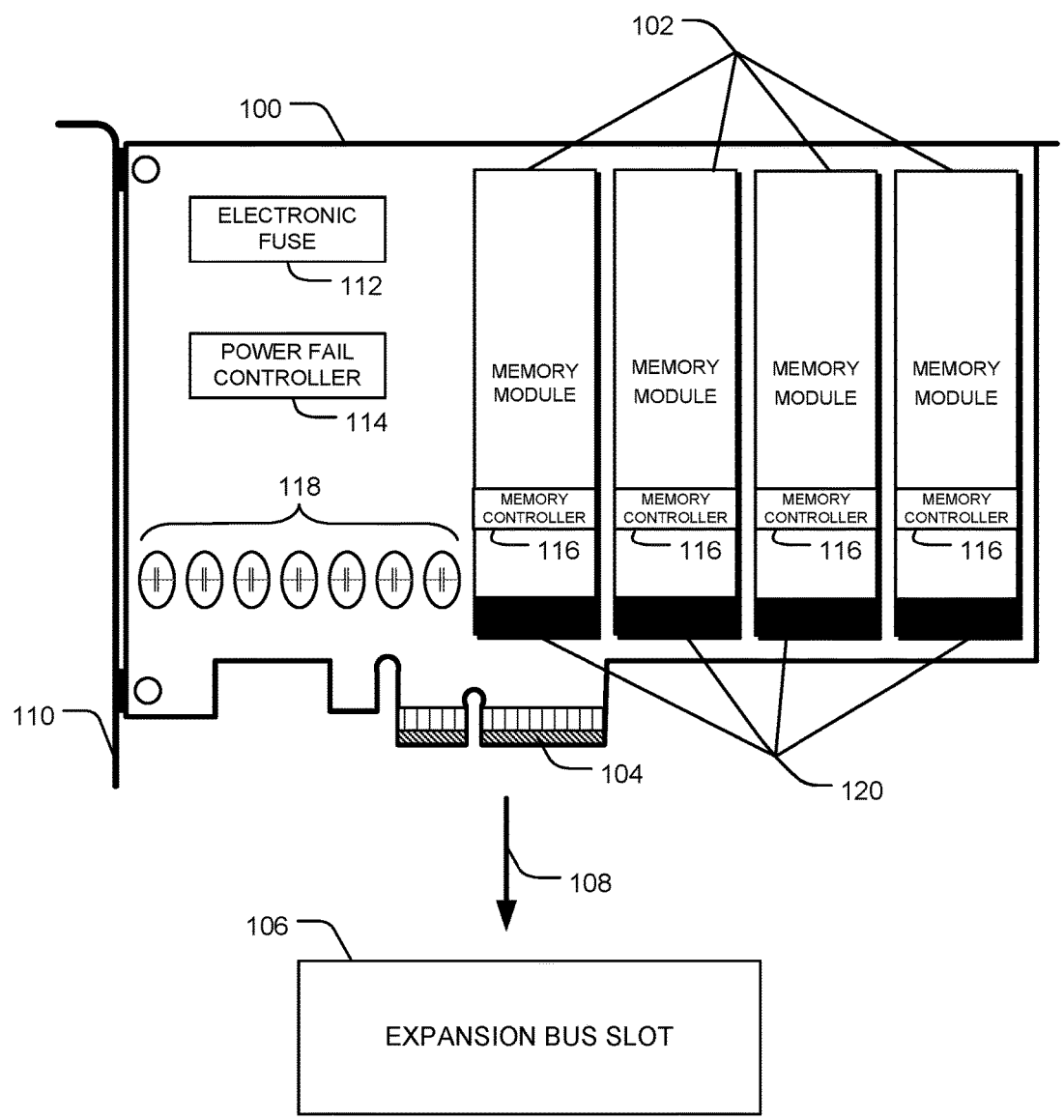
FIG. 1 is a schematic diagram of an example carrier board with removable memory modules.

The present disclosure includes a system and methods for providing data protection to removable memory modules on a carrier board in the event of a power failure. One type of carrier board is a circuit board containing electronics configured for use with a computer motherboard via an expansion bus. In some embodiments, the carrier board is configured for use in a storage server or rack system in a data center. A carrier board may generally contain various types of circuitry for use with the computer, such as audio, video, data storage, network communications, external input/output modules, etc. There may be size restrictions on a carrier board. The carrier board must accommodate the expansion bus interface with the motherboard of the host computing system. The carrier board must have a sufficiently low profile so as not to interfere with other carrier boards installed on the motherboard, especially in a low profile server such as a rack server. The carrier board must not extend so far laterally that it does not fit inside a computer case, server drawer, rack mount, etc.

Since the carrier board disclosed herein has power protection capabilities, it is not necessary for the modular data storage devices connected to the carrier board, such as the solid state drive (SSD) storage devices, to have redundant power protection capabilities. Locating energy storage components on the carrier board instead of on the connected data storage devices decreases cost and increases performance of the carrier board. Upgrade and/or replacement of modular data storage devices that do not include power protection capabilities themselves is cheaper because power protection hardware on the carrier board may be reused rather than being discarded as would be the case when the power protection hardware is on-board the modular data storage devices. Further, when located on the carrier board, energy storage components may be larger than possible when located on the data storage devices without exceeding form factor requirements. The carrier board may therefore provide an increased amount of stored energy to the data storage devices, which reduces the likelihood that data will be lost in the event of an unexpected power failure. In some embodiments, this design can be used in an All Flash Array (AFA).

On carrier boards incorporating data storage media, such as carrier boards with bus connectors to support multiple individual removable memory modules, power failures (in some embodiments, unplanned power failures) may cause data loss and/or data corruption. Data that is waiting in volatile memory to be written to non-volatile memory and/or data that is undergoing in-progress write operations is especially at-risk. Power protection circuitry added to individual removable memory modules connected to a carrier board via a bus connection adds cost to the carrier boards because, if the power protection circuitry is part of the individual memory modules, then upgrading and/or replacing the individual memory modules may require replacing the power protection circuitry. Moreover, including power protection circuitry directly on individual memory modules connected to carrier boards may cause the carrier board/removable memory module combination to exceed the space available in the host computing system chassis, causing the carrier boards not to physically fit into certain chassis configurations, such as on a rack server configuration. Performance gains are possible when the power storage capacity is increased due to more printed circuit board (PCB) space being available on the carrier. More space on the PCB allows the firmware to increase the amount of cache data being protected in the faster, volatile memory.

FIG. 1 is a schematic diagram of an example carrier board 100 with removable memory modules 102. The carrier board 100 may be a printed circuit board for use in a host computing system. The carrier board 100 may be connected to the host computing system via an expansion bus slot 106 via expansion bus connector 104. The expansion bus connector 104 communicates signals to and from the host computing system and receives a voltage source from the carrier board 100 via expansion bus slot 106. The host computing system may include multiple expansion bus slots for accepting a carrier boards via bus connectors such as expansion bus connector 104. Expansion bus formats characterized as high-speed serial computer formats for expansion bus connect 104 include without limitation PCI, PCI-X, AGP, ISA, PCI-E, SATA, USB, etc. In one implementation, expansion bus connector 104 is a PCIe bus connector that mates with PCIe slot 106 in the direction shown by arrow 108. Depending on the form factor, the carrier board 100 may include a bracket 110 that fits into a slot on a case of the host computing system.

A carrier board may expand on or add features that are not available on the motherboard of the host computing system incorporating the carrier board. Carrier board capabilities include without limitation audio, video, input/output, specialized computational (e.g., floating point calculations, algorithmic computations such as a cryptographic hash, etc.), data storage, networking, etc. For example, in an enterprise computing environment, it may be needed to increase the solid state data storage capacity of a server. Such an expansion may be accomplished by adding one or more carrier boards 100 with bus connectors 120 to support individual removable memory modules 102. The carrier board 100 may be inserted into expansion bus slots in the host computing system, e.g., the enterprise computing server. In one implementation, each of the memory modules 102 includes 1 Terabyte of data storage capacity. Thus, the addition of a carrier board 100 with four memory modules 102 would increase the solid state storage capacity of a server by 4 Terabytes.

The carrier board 100 includes control circuitry configured to protect data against loss in the event of an unexpected power loss to the host computing system.

One implementation of control circuitry on the carrier board 100 includes an electronic fuse 112 (also referred to herein as an E-Fuse). The electronic fuse 112 may be electrically connected to the expansion bus connector 104 and may receive power from a voltage source of the host computing system incorporating the carrier board 100. If the host computing system incorporating the carrier board 100 fails to supply a voltage to the carrier board 100, or if the voltage source of the host computing system incorporating the carrier board 100 satisfies a power failure condition, the electronic fuse 112 may "blow," thus indicating power failure to one or more other components of the carrier board 100. For example, if the voltage of the host computing system incorporating the carrier board 100 satisfies a power failure condition, the electronic fuse 112 may indicate to a power fail controller 114 to transmit signals to one or more other components of the carrier board 100 including to the memory modules 102. In an implementation, the voltage source of the host computing system incorporating the carrier board 100 meets a power failure condition if the voltage departs from a standard voltage by more than a predetermined amount. For example, if the host computing system incorporating the carrier board 100 is expected to supply a voltage of +12V, then a voltage of only +10.5V may satisfy a power failure condition.

Another type of power protection circuitry on the carrier board 100 is a power fail controller 114. The power fail controller 114 receives a signal from the electronic fuse 112 if the voltage received from the host computing system incorporating the carrier board 100 satisfies a power failure condition. The power fail controller 114 may implement in part the process on the carrier board 100 of gracefully shutting down and securing data in the event of an unexpected power failure. In an implementation, the power fail controller 114 signals a memory controller 116 that a power failure condition has been satisfied. The signal from the power fail controller 114 includes instructions to one or more memory controllers 116 on the memory modules 102 to complete any date write operations that are not completed on the memory modules 102. There may be, for example, data write operations that are in progress on the memory modules 102 at the time that the power failure condition is satisfied. Alternatively, or additionally, there may be write operations on data that are cached, such as if write operations are to be made in a batch mode to the memory modules 102. The memory controller 116 may further complete other tasks, including without limitation garbage collection or cache cleanup, on the memory modules 102 after the power failure condition has been satisfied.

The carrier board 100 includes one or more electrical energy storage components 118. The energy storage components 118 store an electrical charge received via a connection to a voltage source received from the host computing system incorporating the carrier board 100. The energy storage components may include without limitation capacitors and/or rechargeable batteries. The voltage is supplied to the energy storage components 118 via the electronic fuse 112. Energy storage components 118 may include a single capacitor. In an implementation, energy storage components 118 are divided into groups or "banks" of capacitors. In yet another implementation, the storage components 118 include supercapacitors. Charging and discharging the energy storage components 118 is controlled by the electronic fuse 112. When the voltage source of the host computing system incorporating the carrier board 100 is nominal, the electronic fuse permits charging of the energy storage components 118. When the voltage source of the host computing system incorporating the carrier board 100 satisfies a power failure condition, the electronic fuse 112 initiates discharge of the energy storage components 118 to power one or more components on the carrier board 100, including without limitation, the power fail controller 114, the memory controllers 116 on the memory modules 102, and/or the memory modules 102 with the energy stored in the energy storage components 118. Such discharge of the energy storage components 118 may involve discharging the electrical charge built up on one or more of the energy storage components 118. For example, such discharging of the electrical charge may result in current flowing out of the one or more of the energy storage components 118. The electronic fuse 112 may enable a reverse blocking feature to make sure that no energy from the energy storage components 118 is fed back into the source.

The carrier board 100 includes bus connectors 120 to connect the memory modules 102 to the carrier board 100 and power protection circuitry located thereon. The bus connectors 120 may be any type of connector that permits the exchange of signals, e.g., user data, control signals, and a voltage between the carrier board 100 and the memory modules 102. The bus connectors 120 permit the selective installation and removal of the individual memory modules 102. The individual memory modules 102 may therefore be upgraded and/or replaced as appropriate without replacing the carrier board 100 and/or the power protection circuitry included thereon. The bus connectors 120 also permit the memory modules to be removed individually. For example, if only one of the memory modules 102 enters a failure mode, only the failing memory module 102 may be replaced without replacing the remaining functioning memory modules 102 or power protection circuitry on the carrier board 100. In an implementation, the memory modules 102 are NAND Flash memory storage devices.

In an implementation, the bus connectors 120 are positioned on the carrier board 100 in a row along the edge of the carrier board 100 nearest the expansion bus connector 104 with the individual memory modules 102 extending vertically away from the expansion bus connector 104. In this configuration, the energy storage components 118 may be positioned nearer the expansion bus connector 104. This configuration is possible on a "short card" format carrier board because the power control circuitry and energy storage components are located on the carrier board 100 and not on the memory modules 102 themselves. A short card format carrier board includes carrier boards measuring substantially 106 mm by 174 mm. This is in contrast to a configuration wherein the energy storage components 118 are located on the individual memory modules 102 because, if the energy storage components 118 are located on the individual memory modules 102, then the individual memory modules 102 would be required to be longer than if the energy storage components 118 are located directly on the carrier board 100. Elongating the memory modules 102 would prevent the individual memory modules 102 from being mounted vertically on the carrier board 100, e.g., with the longitudinal extent of the individual memory modules extending away from the side of the carrier board 100 on which the expansion bus connector 104 is located. Instead, it may be necessary to mount the memory modules 102 horizontally on the carrier board 100, with the longitudinal extent of the individual memory modules 102 parallel to the side of the carrier board 100 on which the expansion bus connector 104 is located. Mounting the individual memory modules 102 such that their horizontal extent is parallel to the expansion bus connector 104 on the carrier board 100 would prevent the carrier board 100 from fitting into a short card form factor and would instead require a long card form factor, which would not be compatible with the chassis configuration of some host computing systems and would thus increase the cost of producing the carrier board.

The carrier board 100 may be able to be incorporated into in a variety of host computing systems. One type of host computing system is server in a rack with a low profile configuration for stacking together with other servers. In these low profile servers, a limited amount of space is available a carrier board to be inserted into an expansion bus slot. Particularly, the height of the carrier board must be limited in a low profile server configuration. Locating the energy storage components 118 on the carrier board 100 instead of on the memory modules 102 allows the use of taller energy storage components than would be possible if the energy storage components 118 were located on the memory modules 102, while still meeting the requirements of the low profile server chassis.

Another advantage of locating the energy storage components 118 on the carrier board 110 directly instead of on the individual memory modules 102 is improved airflow around the carrier board 100. A host computing system incorporating the carrier board 100 is likely to enclose the carrier board 100 in a chassis with multiple other components that produce heat, including without limitation processors, power supplies, and/or other carrier boards such as multiple instances of the carrier board 100. If the temperature inside the host computing system incorporating the carrier board 100 becomes too high, the host computing system incorporating the carrier board 100 may be forced to deactivate one or more heat-producing components or even to shut down entirely. In such an environment, fans and other cooling solutions may be needed to limit the temperature inside the host computing system incorporating the carrier board 100. Locating the energy storage components 118 on the carrier board 100 allows for cooling the carrier board 100 with airflow from more than one direction, also known as bi-directional airflow. The effectiveness of the cooling inside the host computing system incorporating the carrier board 100 is thus improved by locating the energy storage components 118 directly on the carrier board 100. Locating the energy storage components 118 on the carrier board 100 directly instead of on the individual memory modules 102 also improves signal integrity for routing high speed signals from the memory module bus connectors 120 to the memory controllers 116 and/or further eliminates switching noise from being coupled onto the high speed signals.

Figure 2:
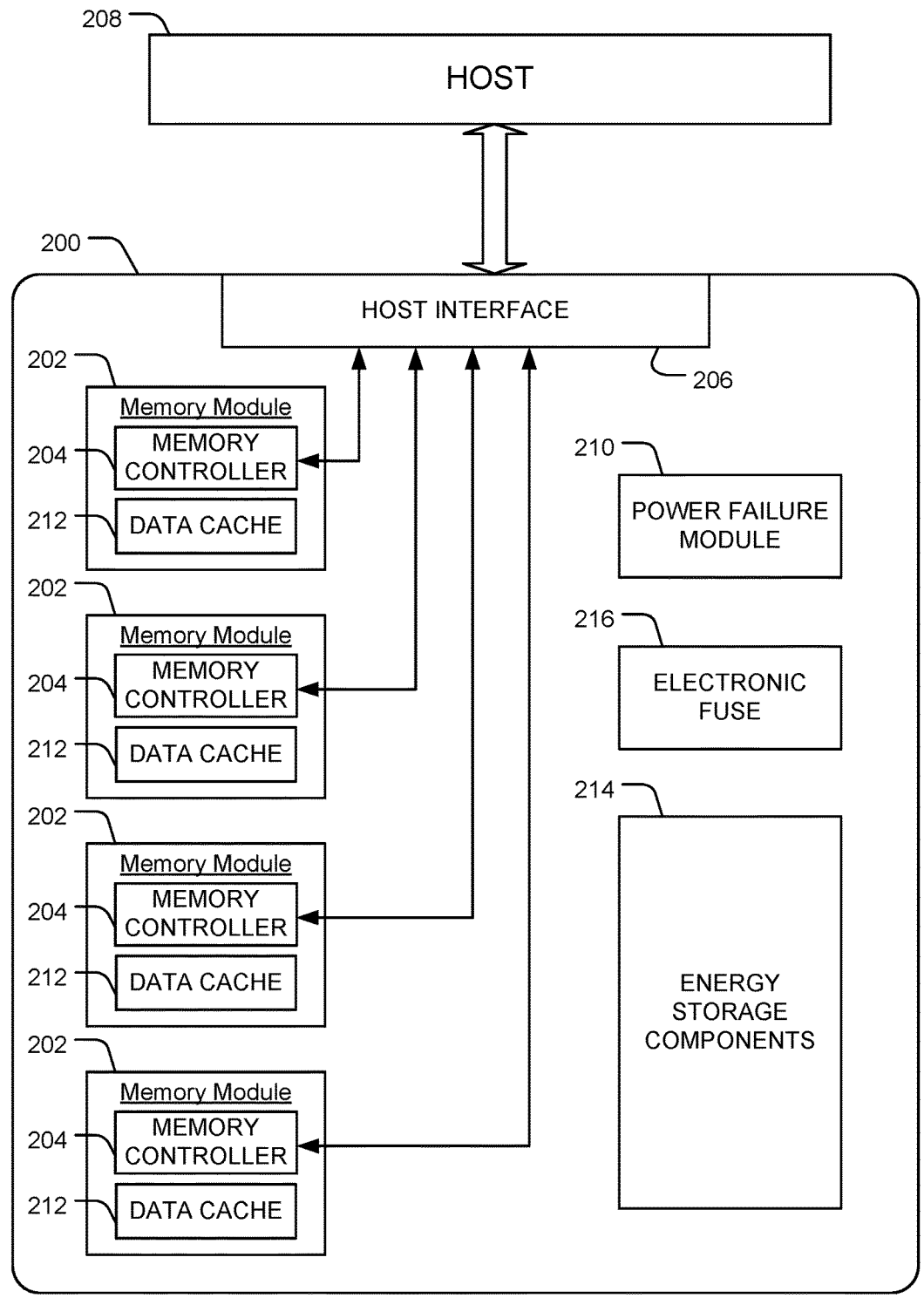
FIG. 2 is block diagram of an example carrier board with removable memory modules in communication with a host.

FIG. 2 is block diagram of an example carrier board 200 with individual removable memory modules 202 in communication with a host 208. The removable memory modules 202 include memory controllers 204 in communication with the host 208 via a host interface 206. In an implementation, the host interface 206 is an expansion computing bus, such as a PCI-e bus. The memory controllers 204 support read and write requests from the host 208 via the host interface 206 to the respective memory modules 202. For example, the host 208 may request data stored on one or more of the memory modules 202 by reference to one or more logical block addresses by sending a read request to a memory controller 204. The memory controller 204 maps the logical block addresses received from the host 208 to the physical block addresses on the memory module 202, and returns the requested data to the host 208 via the host interface 206. Similarly, the host 208 may request to write data to one or more logical block addresses on a memory module 202 by sending a write request to the memory controller 204 on the memory module 202. The memory controller 204 receives the data to be written from the host 208 via the host interface 206 and writes the data to physical blocks on the memory module 202 corresponding to the logical block addresses received from the host 208.

The carrier board 200 includes a power failure module 210. The power failure module 210 is configured to take actions to prevent the loss of data in the event of an unexpected power loss by the carrier board 200 and/or the host 208. When a memory controller 204 receives a signal that a power failure condition has been satisfied, the power failure module 210 instructs the memory controller 204 to complete any write operations that are in progress at the time the power failure condition signal was received by the memory module 202 associated with the memory controller 204. The power failure module 210 may further instruct a memory controller 204 to perform write operations on any data that is stored in volatile memory and/or queued for writing to the memory modules 202 associated with the memory controller 204, such as data in data cache 212. The power failure module 210 may further instruct a memory controller 204 to perform any operations that may be necessary to secure the data on the memory module 202 before the electrical energy from the energy storage components on carrier board 200 runs out, such as completion of garbage collection operations on memory module 202, migration of data on memory module 202, etc. The carrier board 200 further includes power storage components 214 electrically connected to both the memory controller 204 and the memory modules 202 to provide power in the event of a power loss to the host 208.

FIG. 2 including an electronic fuse (or E-Fuse) 216. The electronic fuse 216 may be electrically connected to the host 208 via the host interface 206 and may receive power from a voltage source of the host 208. If the host 208 fails to supply a voltage to the carrier board 200, or if the voltage source of the host 208 satisfies a power failure condition, the electronic fuse 216 may "blow," thus indicating power failure to one or more other components of the carrier board 200. For example, if the voltage of the host 208 satisfies a power failure condition, the electronic fuse 216 may indicate to the power failure module 210 to transmit signals to one or more other components of the carrier board 200 including to the memory modules 202 and/or the memory controllers 204 located thereon. In an implementation, the voltage source of the host 208 meets a power failure condition if the voltage departs from a standard voltage by more than a predetermined amount. For example, if the host 208 is expected to supply a voltage of +12V, then a voltage of only +10.5V may satisfy a power failure condition.

Figure 3:
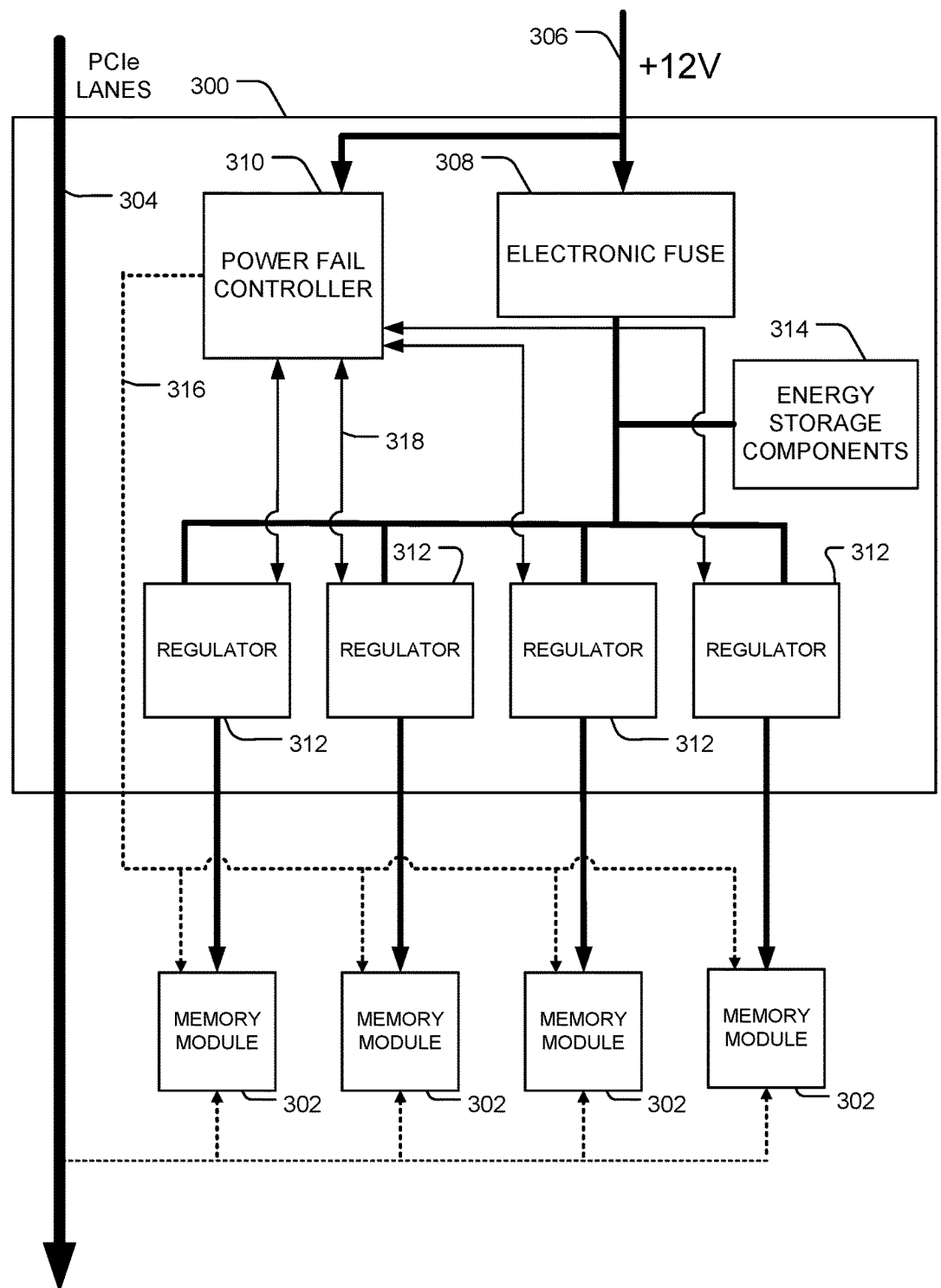
FIG. 3 is a schematic diagram of an example carrier board with removable memory modules.

FIG. 3 is a schematic diagram of an example carrier board 300 with removable individual memory modules 302. In an implementation, the carrier board 300 includes PCIe lanes 304 for communicating signals to and from a host computing system incorporating the carrier board 300, such as from a memory controller on the carrier board 300. The carrier board 300 receives electrical power from a voltage source 306. The voltage source 306 may emanate from an expansion computing bus slot on a host computing system incorporating the carrier board 300. The voltage source 306 may also emanate from a separate electrical connection with the power supply of a host computing system incorporating the carrier board 300. In one implementation, the voltage source 306 is 12V.

On the carrier board 300, the electronic fuse 308 and the power fail controller 310 are electrically connected to the voltage source 306. The electronic fuse 308 acts as a power multiplexer to supply other components on the carrier board 300 with power. For example, the electronic fuse 308 supplies the energy storage components 314 and the voltage regulators 312 with power. Under normal power conditions, the electronic fuse 308 charges energy storage components 314 with power from voltage source 306. The electronic fuse 306 also supplies the memory modules 302 with power via voltage regulators 312. In an implementation, voltage regulators 312 step voltage down from 12V to 3.3V.

The power fail controller 310 is in electrical communication with the memory modules 302 via communication line 316. The power fail controller 310 is configured to take actions to prevent the loss of data in the event of an unexpected power loss by the carrier board 300. When a memory module 302 receives a signal that a power failure condition has been satisfied, the power failure controller 310 instructs the memory modules 302 (and/or a memory controller residing on the memory module 302) to complete any write operations that are in progress at the time the power failure condition signal was received by the memory module 302. The power fail controller 310 may further instruct a memory module 302 (and/or a memory controller residing on the memory module 302) to perform write operations on any data that is stored in volatile memory and/or queued for writing to the memory modules 302. The power fail controller 310 may further instruct a memory module 302 to perform any operations that may be necessary to secure the data on the memory module 202 before the electrical energy from the energy storage components 314 on carrier board 300 runs out, such as completion of garbage collection operations on memory module 302, migration of data on memory module 302, etc.

In an implementation, the regulators 312 may communicate a failure to the power failure controller 310 via communication lines 318 (for readability, not all communication lines 318 are labeled in FIG. 3). If an individual regulator 312 fails, then the failing regulator's communication to the power failure controller 310 may trigger a power loss actions applying only to the memory module 302 with the corresponding failing regulator 312. For example, if a regulator 312 fails, then it may communicate a failure signal to the power fail controller 310 that causes the power fail controller 310 to instruct the memory module 302 (and/or a memory controller residing on the memory module 302) to complete any write operations that are in progress at the time the regulator 312 failure condition signal was received by the power fail controller 310. The power fail controller 310 may further instruct the memory module 302 (and/or a memory controller residing on the memory module 302) associated with the failing regulator 312 to perform write operations on any data that is stored in volatile memory and/or queued for writing to the memory module 302.

Figure 4:
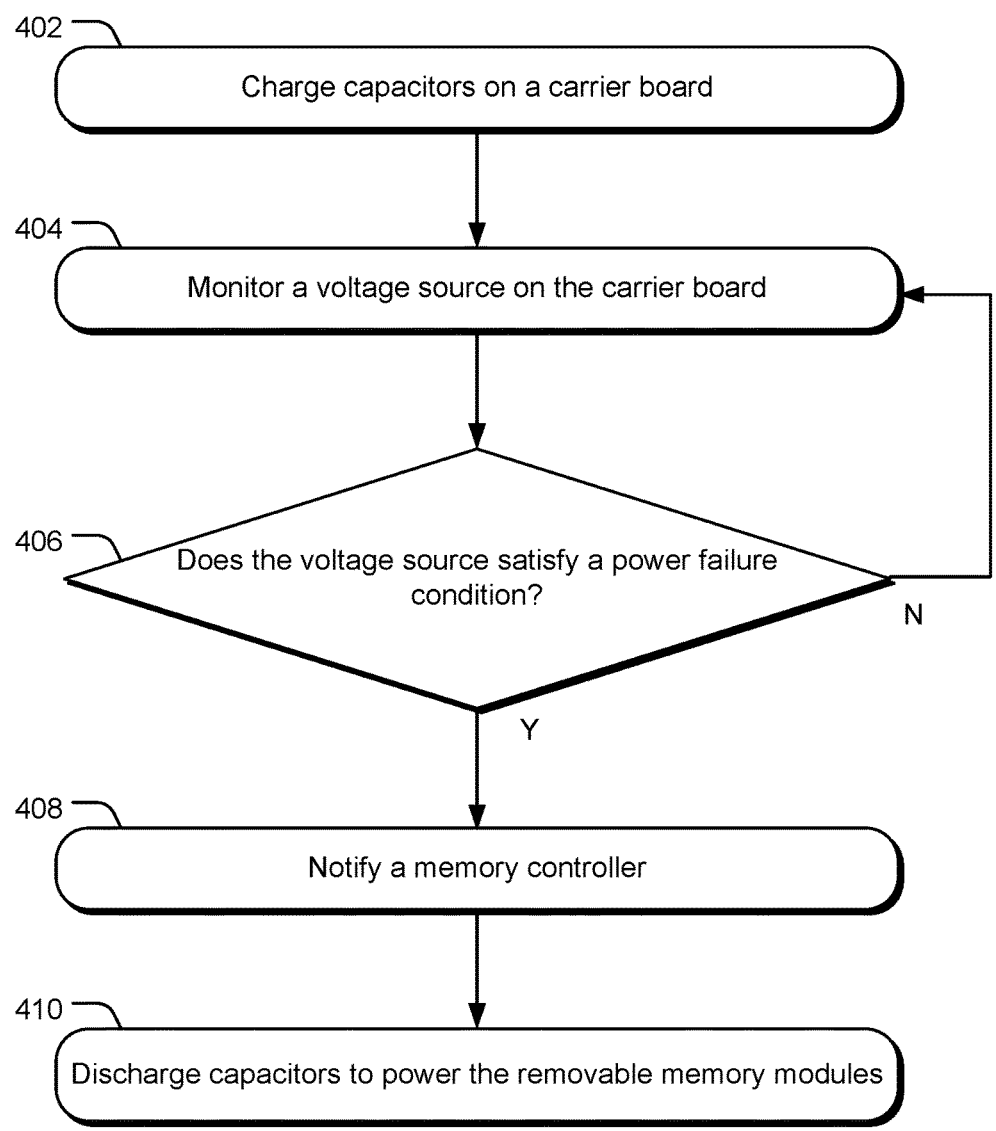
FIG. 4 illustrates example operations for protecting data in the event of a power failure on a carrier board with removable memory modules.

FIG. 4 illustrates example operations 400 for protecting data in the event of a power failure on a carrier board with removable memory modules. Operation 402 is charge energy storage components on a carrier board. The energy storage components may be charged by a voltage source supplied to the carrier board from a host computing system incorporating the carrier board, such as by an expansion bus slot or by an electrical connector from a power supply on the host computing system. In an implementation, the energy storage components are located directly on the carrier board rather than on the removable memory modules. Locating the energy storage components directly on the carrier board rather than on the removable memory modules allows for several advantages. One advantage is that the components on the carrier board may fit into a smaller form factor, such as a "short card" form factor. Another advantage of locating the energy storage components on the carrier board rather than on the removable memory modules is that taller energy storage components may be used without exceeding the size limitations needed for the carrier board to fit in a low profile server chassis. Another advantage of locating the energy storage components on the carrier board rather than on the removable memory modules is reduction of the cost of operating the carrier board because removable memory modules may be replaced and/or upgraded without discarding the energy storage components, as would be necessary if the energy storage components were integrated into the removable memory modules.

Operation 404 is monitor a voltage source on the carrier board. The voltage source on the carrier board may be supplied via an expansion bus slot and/or by a connection to the power supply of a host computing system incorporating the carrier board. The voltage source may be monitored according to whether it remains within a tolerance voltage value. Operation 406 is a decision block depending on whether the monitored voltage source satisfies a power failure condition. In one implementation, a voltage source satisfies a power failure condition if the voltage drops to zero. In another implementation, a voltage source satisfies a power failure condition if the voltage source is interrupted for more than a predetermined time. In yet another implementation, a voltage source satisfies a power failure condition if the voltage exceeds a predetermined value or falls below a predetermined value. In yet another implementation, a voltage source satisfies a power failure condition if the voltage source is not sufficient to permit normal operation of the components on the carrier board.

If the determination at decision block 406 is that the voltage source does not satisfy a power failure condition, then the method returns to operation 404. If the determination at decision block 406 is that the voltage source does satisfy a power failure condition, then operation 408 notifies a memory controller that the power failure condition has been satisfied. In response to the notification that a power failure condition has been satisfied, the memory controller may initiate preservation of data at risk of loss. For example, the memory controller may complete write operations that are in progress at the time the power failure condition is satisfied. The memory controller may further write any data that has been requested to be written by a host but it queued in a volatile write cache. The memory controller may further perform any operations on the removable memory modules such as migrating data in a garbage collection operation, etc.

Operation 410 is initiate discharge of energy storage components to power the removable memory modules. The energy storage components may power components on the carrier board until such time that the energy storage components are fully discharged or the voltage source is restored. Depending on the needs of the memory controller, operation 410 may initiate discharge of the energy storage components to power less than all of the removable memory modules. Such discharge of the energy storage components may involve discharging the electrical charge built up on one or more of the energy storage components. For example, such discharging of the electrical charge may result in current flowing out of the one or more of the energy storage components. For example, if a removable memory module does not contain any data that must be written, migrated, etc., operation 410 may divert any power that would have been consumed by the memory module that does not require it to one or more of the other memory modules on the carrier board. Operation 410 may be performed concurrently with, before, and/or after operation 408.

The implementations described herein are implemented as logical operations in one or more computer systems. The logical operations may be implemented (1) as a sequence of processor-implemented operations executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, operations, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

What is claimed is:

1. A carrier board comprising:
   one or more bus connectors configured to connect to a plurality of removable memory modules, the bus connectors configured to communicate at least one of control signals, user data, and a voltage between the carrier board and one of the removable memory modules;
   one or more energy storage components located on the carrier board;
   one or more voltage regulators electrically disposed between the energy storage components and the bus connectors; and
   control circuitry located on the carrier board and configured to charge the energy storage components, the control circuitry configured to initiate discharge of the energy storage components to power one or more of the removable memory modules in response to a power failure condition.

2. The carrier board of claim 1, wherein one or more of the plurality of removable memory modules does not include on-board power protection circuitry on the removable memory module and the power failure condition is an unexpected power failure condition.

3. The carrier board of claim 1, wherein:
   the control circuitry is further configured to notify a memory controller in response to the power failure condition; and
   the memory controller is configured to complete, in response to the notification, one or more write operations in progress to one or more of the removable memory modules.

4. The carrier board of claim 1, wherein the carrier board is a short card carrier board and a longitudinal extent of the removable memory modules extends away from a PCIe expansion bus connector on the carrier board.

5. The carrier board of claim 1, wherein the control circuitry includes a power multiplexer between a voltage source and the energy storage components.

6. The carrier board of claim 1, wherein the control circuitry includes a power fail controller and the carrier board comprises a M.2 expansion card.

7. The carrier board of claim 1, wherein the one or more voltage regulators are configured to step down voltage output from the energy storage components prior to powering the removable memory module.

8. A method comprising:
   charging one or more electrical energy storage components mounted on a circuit board containing electronics, the circuit board including one or more bus connectors configured to communicate at least control signals, user data, and a voltage between the circuit board and a removable memory module;
   monitoring a voltage source on the circuit board;
   notifying a memory controller if the voltage source satisfies a power fail condition;
   initiating discharge of at least one of the one or more electrical energy storage components to power at least the removable memory module in response to the power fail condition; and
   stepping down voltage output from the electrical energy storage components prior to powering the removable memory module.

9. The method of claim 8, further comprising:
   completing data write operations in progress after the voltage source satisfies the power fail condition.

10. The method of claim 8, wherein the removable memory modules do not include on-board power protection circuitry and the electrical energy storage components comprise one or both of capacitors and batteries.

11. The method of claim 8, wherein the circuit board is a short card carrier board and a longitudinal extent of the removable memory modules extends away from an expansion bus connector on the circuit board.

12. The method of claim 8, wherein the control circuitry includes one or more voltage regulators, the voltage regulators electrically disposed between the one or more energy storage components and the one or more bus connectors.

13. The method of claim 8, wherein the voltage source is supplied by a host computing system and the power fail condition is an unexpected power fail condition.

14. A computer system comprising:
 one or more processors;
 a memory;
 an expansion bus slot;
 a carrier board in communication with the expansion bus slot, the carrier board comprising:
  one or more bus connectors, each bus connector configured to mate with one of a plurality of memory modules, the one or more bus connectors configured to communicate at least one of control signals, user data, and a voltage between the carrier board and one of the memory modules;
  one or more capacitors mounted on the carrier board;
  one or more voltage regulators electrically disposed between the capacitors and the bus connectors; and
  control circuitry mounted on the carrier board and configured to charge the capacitors, the control circuitry further configured to initiate discharge of the capacitors to power one or more of the memory modules in response to an unexpected power failure condition.

15. The computer system of claim 14, wherein the memory modules do not include on-board power protection circuitry on the memory modules and the memory modules are removable.

16. The computer system of claim 14, wherein:
 the control circuitry is further configured to notify a memory controller in response to the unexpected power failure condition; and
 the memory controller is configured to complete, in response to the notification, one or more in progress write operations to one or more of the memory modules.

17. The computer system of claim 14, wherein the carrier board is a short card carrier board and a longitudinal extent of the memory modules extends away from an expansion bus connector on the carrier board.

18. The computer system of claim 14, wherein the control circuitry includes a power multiplexer between a voltage source and the one or more capacitors.

19. The computer system of claim 14, wherein the control circuitry includes a power fail controller and the system is configured as an All Flash Array (AFA).

20. The computer system of claim 14, wherein the one or more voltage regulators are configured to step down voltage output from the one or more capacitors prior to powering the removable memory module.

* * * * *